(12) United States Patent
Kim et al.

(10) Patent No.: US 12,087,810 B2
(45) Date of Patent: Sep. 10, 2024

(54) CAPACITOR AND ELECTRONIC DEVICE INCLUDING THE SAME

(71) Applicant: Samsung Electronics Co., Ltd., Suwon-si (KR)

(72) Inventors: Jinhong Kim, Seoul (KR); Changsoo Lee, Seoul (KR); Yongsung Kim, Suwon-si (KR); Euncheol Do, Seoul (KR); Jooho Lee, Hwaseong-si (KR); Yong-Hee Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 239 days.

(21) Appl. No.: 17/715,389

(22) Filed: Apr. 7, 2022

(65) Prior Publication Data

US 2023/0080072 A1  Mar. 16, 2023

(30) Foreign Application Priority Data

Sep. 14, 2021 (KR) .......................... 10-2021-0122774

(51) Int. Cl.
*H10B 12/00* (2023.01)
*H01L 49/02* (2006.01)

(52) U.S. Cl.
CPC .............. *H01L 28/65* (2013.01); *H01L 28/75* (2013.01); *H10B 12/30* (2023.02)

(58) Field of Classification Search
CPC ......... H01L 28/56; H01L 28/57; H01L 28/65; H01L 28/75; H10B 12/30
See application file for complete search history.

(56) References Cited

U.S. PATENT DOCUMENTS

| 7,700,988 | B2 | 4/2010 | Lin et al. |
| 7,842,946 | B2 | 11/2010 | Lin et al. |
| 8,697,516 | B2 | 4/2014 | Furukawa et al. |
| 9,105,646 | B2 | 8/2015 | Malhotra et al. |
| 10,338,311 | B2 | 7/2019 | Ouyang et al. |
| 2005/0040481 | A1 | 2/2005 | Shimizu et al. |
| 2007/0001231 | A1 | 1/2007 | Currie |
| 2007/0141778 | A1 | 6/2007 | Lin et al. |

(Continued)

FOREIGN PATENT DOCUMENTS

| CN | 103943476 A | 7/2014 |
| GB | 1325103 A | 8/1973 |

(Continued)

OTHER PUBLICATIONS

Partial European Search Report issued on Oct. 18, 2022 in European Application No. 22174598.7.

(Continued)

*Primary Examiner* — Matthew E Warren

(74) *Attorney, Agent, or Firm* — Harness, Dickey & Pierce, P.L.C.

(57) ABSTRACT

A capacitor including a lower electrode; an upper electrode apart from the lower electrode; and a between the lower electrode and the upper electrode, the dielectric including a dielectric layer including $TiO_2$, and a leakage current reducing layer including $GeO_2$ in the dielectric layer. Due to the leakage current reducing layer, a leakage current is effectively reduced while a decrease in the dielectric constant of the dielectric thin-film is small.

23 Claims, 19 Drawing Sheets

(56) References Cited

U.S. PATENT DOCUMENTS

| | | |
|---|---|---|
| 2008/0149922 A1 | 6/2008 | Lin et al. |
| 2009/0087944 A1 | 4/2009 | Lin et al. |
| 2009/0130457 A1 | 5/2009 | Kim et al. |
| 2010/0237444 A1 | 9/2010 | Lin |
| 2011/0147891 A1 | 6/2011 | Furukawa et al. |
| 2012/0225268 A1* | 9/2012 | Antonov ........... H01L 21/02172 427/126.3 |
| 2014/0080282 A1 | 3/2014 | Chiang et al. |
| 2014/0183695 A1* | 7/2014 | Malhotra ................ H01L 28/56 257/532 |
| 2017/0117282 A1 | 4/2017 | Mathur et al. |
| 2017/0200673 A1 | 7/2017 | Lai et al. |
| 2017/0307823 A1 | 10/2017 | Ouyang et al. |
| 2020/0091279 A1 | 3/2020 | Moon et al. |
| 2020/0098518 A1 | 3/2020 | Lee et al. |
| 2020/0105633 A1* | 4/2020 | Lee ....................... H01L 23/291 |
| 2022/0149804 A1 | 5/2022 | Razzell |

FOREIGN PATENT DOCUMENTS

| | | |
|---|---|---|
| JP | 2009-049068 A | 3/2009 |
| JP | 2009-170857 A | 7/2009 |
| JP | 2019-046953 A | 3/2019 |
| JP | 2019-057621 A | 4/2019 |
| KR | 10-2007-0040714 A | 4/2007 |
| KR | 10-2013-0092001 A | 8/2013 |
| KR | 20200033013 A * | 3/2020 ............. H01L 28/75 |

OTHER PUBLICATIONS

Extended European Search Report issued Mar. 9, 2023 in European Application No. 22174598.7.
Seong Keun Kim et al, "Capacitors with an Equivalent Oxide Thickness . . . " Adv. Funct. Mater., 20, pp. 2989-3003, Sep. 2010.
Woojin Jeon, "Recent advances in the understanding of high-k dielectric; materials deposited by atomic layer deposition for; dynamic random-access memory capacitor applications"J. Mater. Res. vol. 32, pp. 775-794, Apr. 14, 2019.
Seong Keun Kim et al, "High dielectric constant TiO2 thin films on a Ru electrode grown; at 250 by atomic-layer deposition"Appl. Phys Lett., vol. 85, No. 18, Nov. 1, 2004.
S. Chae et al, "Epitaxial stabilization of rutile germanium oxide thin film by; molecular beam epitaxy"Appl. Phys Lett., vol. 117,072105, Aug. 21, 2020.
Toshihide Nabatame, "Characteristics of RuO2/TiO2/Al2O3/TiO2/RuO2 Capacitors," ECS Trans., vol. 80, No. 1, pp. 365-371, 2017.
Office Action issued Nov. 29, 2023 in Korean Application No. 10-2021-0122774.
Office Action issued Dec. 4, 2023 in Japanese Application No. 2022-144547.

* cited by examiner

CAPACITOR AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2021-0122774, filed on Sep. 14, 2021, in the Korean Intellectual Property Office, the disclosure of which is incorporated by reference herein in its entirety.

BACKGROUND

1. Field

The present disclosure relates to capacitors and electronic devices including the same.

2. Description of the Related Art

As electronic devices undergo down-scaling, the available space occupied by various electronic elements in the electronic devices is also becoming smaller. Therefore, there is a need to reduce the size of electronic elements, such as capacitors, and also to reduce the thicknesses of dielectric layers of the capacitors. However, it is difficult to implement a structure that satisfies a leakage current reference value and that has a thickness of a dielectric layer suitable for a desired capacitance, and thus, solutions in this regard have been continuously sought.

SUMMARY

Provided are capacitors with improved leakage current characteristics and electronic devices including the same.

Additional aspects will be set forth in part in the description which follows and, in part, will be apparent from the description, or may be learned by practice of the presented embodiments of the disclosure.

According to an aspect of an embodiment, a capacitor includes: a lower electrode; an upper electrode apart from the lower electrode; and a dielectric between the lower electrode and the upper electrode, the dielectric including a dielectric layer including $TiO_2$, and a leakage current reducing layer inserted including $GeO_2$ in the dielectric layer.

The lower electrode may have a rutile phase.

The lower electrode may include $SnO_2$ doped with a dopant including at least one of a metal or a metal oxide.

The dopant may include at least one of $RuO_2$, $IrO_2$, $MoO_2$, Nb, Ta, Sb, Mn, or F, and the dopant may be included in an amount between 0.01 at % and 10 at %.

The dielectric layer may include Ga, Al, La, B, In, Sc, or Y, as a dopant, in an amount of 10 at % or less.

The leakage current reducing layer may include Ga, Al, La, B, In, Sc, Y, Ti, Zr, or Hf, as a dopant, in an amount of 50 at % or less.

The leakage current reducing layer may have at least one of a rutile phase or an amorphous phase.

The dielectric layer may have a rutile phase.

The dielectric may be a thin-film having a thickness of 200 Å or less.

The leakage current reducing layer may have a of 50 Å or less.

A ratio of a thickness of the leakage current reducing layer to a total thickness of the dielectric may be in a range from 0.5% to 40%.

The dielectric may have a dielectric constant of 50 or more and a conduction band offset (CBO) of 0.6 eV or more.

According to an aspect of another embodiment, a capacitor includes: a lower electrode; an upper electrode apart from the lower electrode; and a dielectric between the lower electrode and the upper electrode, the dielectric including a first dielectric layer including $TiO_2$, a second dielectric apart from the first dielectric layer, the second dielectric layer including $TiO_2$, and a leakage current reducing layer between the first dielectric layer and the second dielectric layer. The leakage current reducing layer may include $GeO_2$.

The lower electrode may have a rutile phase.

The first dielectric layer and the second dielectric layer may have a rutile phase.

The first dielectric layer and the second dielectric layer may each independently include at least one of Ga, Al, La, B, In, Sc, or Y, as a dopant, in an amount of 10 at % or less.

The dopant of the first dielectric layer and the dopant of the second dielectric layer may differ in at least one of the amount or the at least one of Ga, Al, La, B, In, Sc, or Y.

The leakage current reducing layer may include at least one of Ga, Al, La, B, In, Sc, Y, Ti, Zr, or Hf, as a dopant, in an amount of 50 at % or less.

A ratio of a thickness of the leakage current reducing layer to a total thickness of the dielectric may be in a range from 0.5% to 40%.

According to an aspect of another embodiment, an electronic device includes: a transistor; and one of the above-described capacitors electrically connected to the transistor.

The transistor may include: a substrate including a source region, a drain region, and a channel region between the source region and the drain region; and a gate stack on the substrate and facing the channel region. The gate stack including a gate insulating layer and a gate electrode.

The transistor may include: a substrate including a source region, a drain region, and a channel region between the source region and the drain region; and a gate stack in a trench recessed from a surface of the substrate and facing the channel region. The gate stack including a gate insulating layer and a gate electrode.

The electronic device may further include: a memory unit including the capacitor and the transistor; and a control unit electrically connected to the memory unit and configured to control the memory unit.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
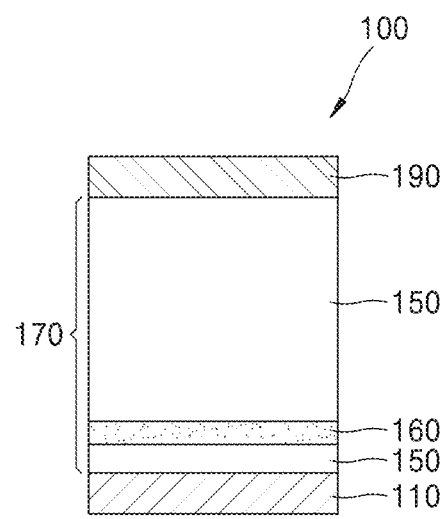
FIG. 1 is a cross-sectional view illustrating a schematic structure of a capacitor, according to some example embodiments.

Reference will now be made in detail to some embodiments, examples of which are illustrated in the accompanying drawings, wherein like reference numerals refer to like elements throughout, and the size of each element in the drawings may be exaggerated for clarity and convenience of explanation. In this regard, the present embodiments may have different forms and should not be construed as being limited to the descriptions set forth herein. The embodiments described herein are merely example, and various modifications may be made thereto from these embodiments. Accordingly, the example embodiments are merely described below, and by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. When the terms "about" or "substantially" are used in this specification in connection with a numerical value, it is intended that the associated numerical value includes a manufacturing tolerance (e.g., ±10%) around the stated numerical value Hereinafter, the terms "above" or "on" may include not only those that are directly on (e.g., in a contact manner), but also those that are above in a non-contact manner. Spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly.

It will be understood that although the terms "first," "second," etc. may be used herein to describe various elements, these elements should not be limited by these terms. These terms are only used to distinguish one element from another. These terms, unless indicated otherwise, do not limit the difference in the materials or structures of the elements.

The singular forms "a," "an," and "the" as used herein are intended to include the plural forms as well unless the context clearly indicates otherwise. It will be understood that the terms "comprise," "include," or "have" as used herein specify the presence of stated elements, but do not preclude the presence or addition of one or more other elements.

Also, the terms such as "er/or" and "module" described in the specification, and/or, unless otherwise indicated, any of the functional blocks shown in the figures and described below, may mean units that process at least one function or operation, and may be included in and/or implemented as in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The use of the term "the" and similar demonstratives may correspond to both the singular and the plural.

Operations constituting methods may be performed in any suitable order unless otherwise indicated herein or otherwise clearly contradicted by context. The use of all illustrative terms (for example, etc.) in the embodiments is simply to describe the technical idea in detail, and the scope of the present disclosure is not limited due to the illustrative terms unless they are limited by the claims.

Figure 2:
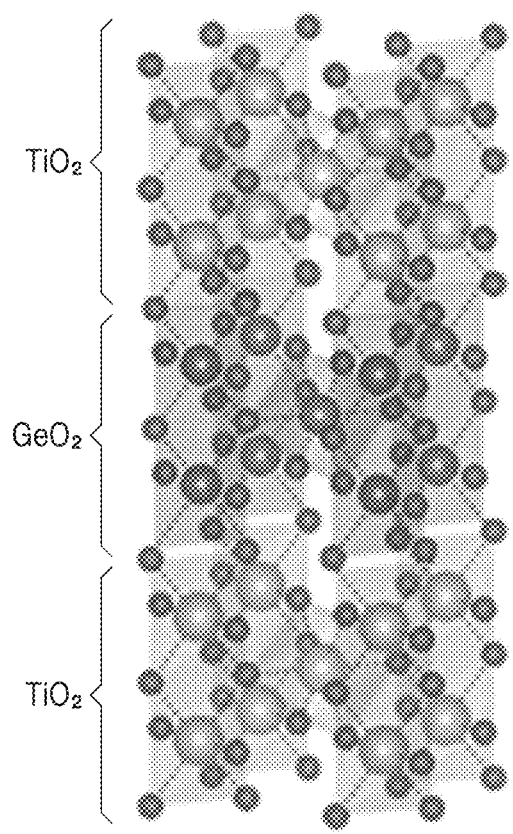
FIG. 2 is a detailed enlarged conceptual diagram illustrating a partial region of a rutile-phase crystal structure of a dielectric thin-film in the capacitor of FIG. 1.

FIG. 1 is a cross-sectional view illustrating a schematic structure of a capacitor 100, according to some example embodiments, and FIG. 2 is a detailed enlarged conceptual diagram illustrating a partial region of a rutile-phase crystal structure of a dielectric thin-film 170 included in the capacitor 100 of FIG. 1.

The capacitor 100 includes a lower electrode 110 and an upper electrode 190 spaced apart from each other, and the dielectric thin-film 170 between the lower electrode 110 and the upper electrode 190. The dielectric thin-film 170 includes a dielectric layer 150 including $TiO_2$ and a leakage current reducing layer 160, including $GeO_2$, inserted into the dielectric layer 150.

The lower electrode 110 may include a material selected to ensure conductivity as an electrode and to maintain stable capacitance performance even after a high-temperature process in the process of manufacturing the capacitor 100. In addition, in some embodiments, the lower electrode 110 may include a conductive material exhibiting a rutile phase so that the dielectric layer 150 on the lower electrode 110 is well made (e.g., such that the dielectric layer 150 comprises rutile-$TiO_2$ having a high dielectric constant with good adhesion to the lower electrode 110 and/or such that the stresses due to potential mismatch interface is reduced and/or eliminated). The rutile phase may, for example, describe a crystalline phase similar to the crystalline phase of rutile phase $TiO_2$, and may, e.g., include a metal oxide of the ditetragonal dipyramidal crystal class. For example, the metal oxide with a rutile phase may comprise, e.g., metal atoms (and/or ions) forming a body-centered tetragonal crystal structure, such that the metal atoms may have a coordination number of 6, and the oxygen atoms may be a coordination number of 3.

The lower electrode 110 may include, for example, Tin (IV) oxide (e.g., $SnO_2$). In some example embodiments, the lower electrode 110 may be doped with a dopant including a metal or a metal oxide. The dopant may include at least one of $RuO_2$, $IrO_2$, $MoO_2$, Nb, Ta, Sb, Mn, and/or F. In some example embodiments, the dopant may be included in an amount not less than 0.01 at % and/or not more than 10 at %. In some example embodiments, the dopant may be selected to shorten the bandgap in the material selected for the lower electrode 110 without affecting the rutile phase and/or may be selected to stabilize the rutile phase of the lower electrode 110.

The dielectric layer 150 included in the dielectric thin-film 170 may include rutile phase $TiO_2$. $TiO_2$ has a different dielectric constant depending on the phase. While anatase phase $TiO_2$ has a dielectric constant of about 40, rutile phase $TiO_2$ may have a greater dielectric constant of about 80 to about 170 depending on the growth direction thereof. In the capacitor 100, according to some example embodiments, because the lower electrode 110 is formed of a rutile phase, and $TiO_2$ formed thereon may be grown as a rutile phase. For example, in some example embodiments, the lower electrode 110 may serve as a seed layer for promoting the initiation and/or growth of rutile-phase $TiO_2$ grown on the lower electrode 110. The dielectric layer 150 may include $TiO_2$ and/or may include $TiO_2$ including a dopant. For example, the dielectric layer 150 may include at least one of Ga, Al, La, B, In, Sc, and/or Y as a dopant. In some example embodiments, the dopant in the dielectric layer 150 may be in an amount not less than 0 at % and/or not more than 10 at %.

Although rutile phase $TiO_2$ exhibits a high dielectric constant, the bandgap may be as low as about 3 eV. Therefore, a dielectric comprising rutile phase $TiO_2$ alone may have a high leakage current, and thus, may be difficult to satisfy the leakage current specification required for the capacitor 100.

The capacitor 100, according to some example embodiments, has a structure in which the leakage current reducing layer 160 including $GeO_2$ is inserted into the dielectric layer 150 to improve leakage current characteristics. Because $GeO_2$ has a great bandgap (of about 4.7 eV), compared with $TiO_2$, the leakage current performance of the dielectric thin-film 170 may be improved. In addition, because the leakage current reducing layer 160 including $GeO_2$ may have a rutile phase (and/or an amorphous phase), the leakage current reducing layer 160 does not interfere with the rutile growth of $TiO_2$. The dielectric layer 150 may maintain the rutile phase before and after the formation of the leakage current reducing layer 160. For example, the dielectric layer 150 may maintain the rutile phase of $TiO_2$ both below and above the leakage current reducing layer 160. The thickness of the dielectric layer 150 below and above the leakage current reducing layer 160 may be different from the illustration of FIG. 1. For example, the leakage current reducing layer 160 may be provided between the dielectric layer 150 and an electrode (e.g., the upper electrode 190).

The leakage current reducing layer 160 may include only $GeO_2$ and/or may include $GeO_2$ including a dopant. For example, the leakage current reducing layer 160 may include at least one of Ga, Al, La, B, In, Sc, Y, Ti, Zr, and/or Hf as a dopant. In some example embodiments, the dopant in the leakage current reducing layer 160 may be in an amount not less than 0 at % and/or not more than 50 at % together with $GeO_2$.

The total thickness of the dielectric thin-film 170 may be 200 angstrom (Å) or less. For example, the total thickness of the dielectric thin-film 170 may be 150 Å or less, and/or may be 100 Å or less.

The thickness of the leakage current reducing layer 160 may be greater than 0 Å and/or less than or equal to 50 Å. For example, the thickness of the leakage current reducing layer 160 may be 10 Å or less, and/or may be in a range from 2 Å to 8 Å.

A ratio of the thickness of the leakage current reducing layer 160 to the total thickness of the dielectric thin-film 170 may be in a range from 0.5% to 40%.

When the dielectric thin-film 170 includes the leakage current reducing layer 160, the dielectric constant may be slightly reduced, compared with the case in which the dielectric thin-film 170 does not include the leakage current reducing layer 160. The reduction amount thereof is insignificant, but a leakage current improvement effect is great. For example, the dielectric thin-film 170 may have a dielectric constant of 50 or more and a conduction band offset (CBO) of 0.6 eV or more.

The upper electrode 190 includes a conductive material. The conductive material of the upper electrode 190 is not particularly limited. For example, like the lower electrode 110, the upper electrode 190 may have a rutile phase, but in some example embodiments, may include various conductive materials having phases other than the rutile phase. The upper electrode 190 may include, e.g., a metal, a metal nitride, a metal oxide, and/or a combination thereof. For example, the upper electrode 190 may include at least one of TiN, MoN, CoN, TaN, W, Ru, $RuO_2$, $SrRuO_3$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCO), and/or any combination thereof.

Figure 3:
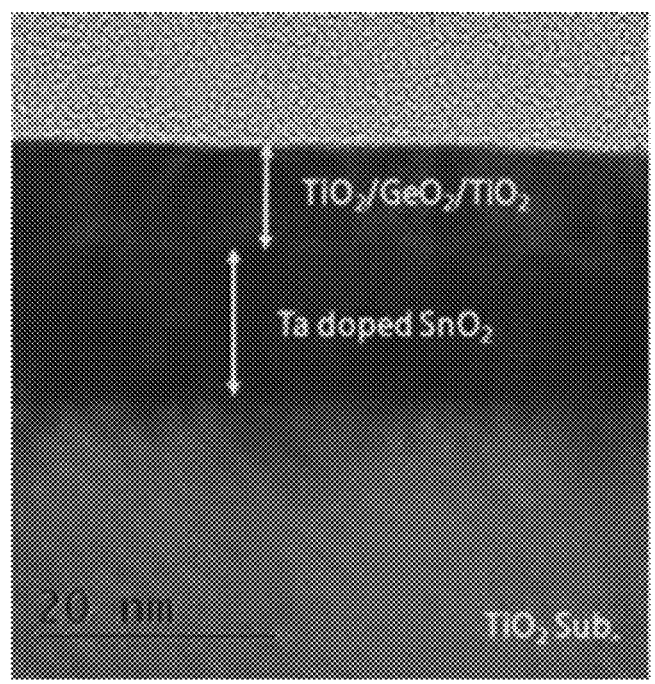
FIG. 3 shows a high-resolution transmission electron microscopy (HR-TEM) photograph of an actually manufactured dielectric thin-film provided in the capacitor of FIG. 1.

FIG. 3 shows a high-resolution transmission electron microscopy (HR-TEM) photograph of a manufactured dielectric thin-film provided in the capacitor of FIG. 1.

A lower electrode (110 of FIG. 1) including Ta-doped $SnO_2$ was grown on a $TiO_2$ substrate by a pulsed laser deposition (PLD) method, and a dielectric thin-film (170 of FIG. 1) including $TiO_2$, $GeO_2$, and $TiO_2$ were sequentially deposited on the Ta-doped $SnO_2$ by a PLD method. In an experiment, a total thickness of $TiO_2$ was 15 nm and a total thickness of $GeO_2$ was 0.5 nm. $GeO_2$ could be epitaxially or semi-epitaxially grown on rutile $TiO_2$, and it was confirmed that the conformity was not broken even after $GeO_2$ was grown and $GeO_2$ was well grown into rutile-$TiO_2$.

Figure 4:
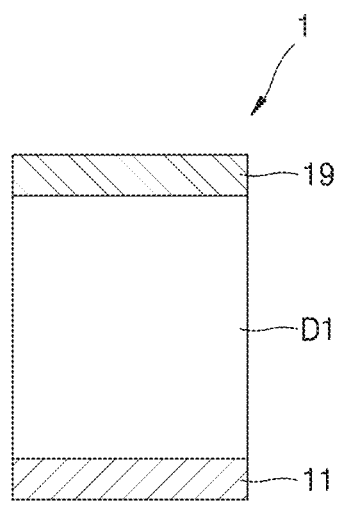
FIG. 4 illustrates a schematic structure of a capacitor according to a Comparative Example 1.

FIG. 4 illustrates a schematic structure of a capacitor 1 according to a Comparative Example 1.

The capacitor 1 according to Comparative Example 1 includes a lower electrode 11, a dielectric layer D1 including rutile-$TiO_2$, and an upper electrode 19. The lower electrode 11 includes Ta-doped $SnO_2$, and the dielectric layer D1 (including rutile-$TiO_2$) on the lower electrode 11 may exhibit a high dielectric constant, but a large amount of leakage current may appear (e.g., compared with an Example of the Example Embodiments of the capacitor 100).

Figure 5:
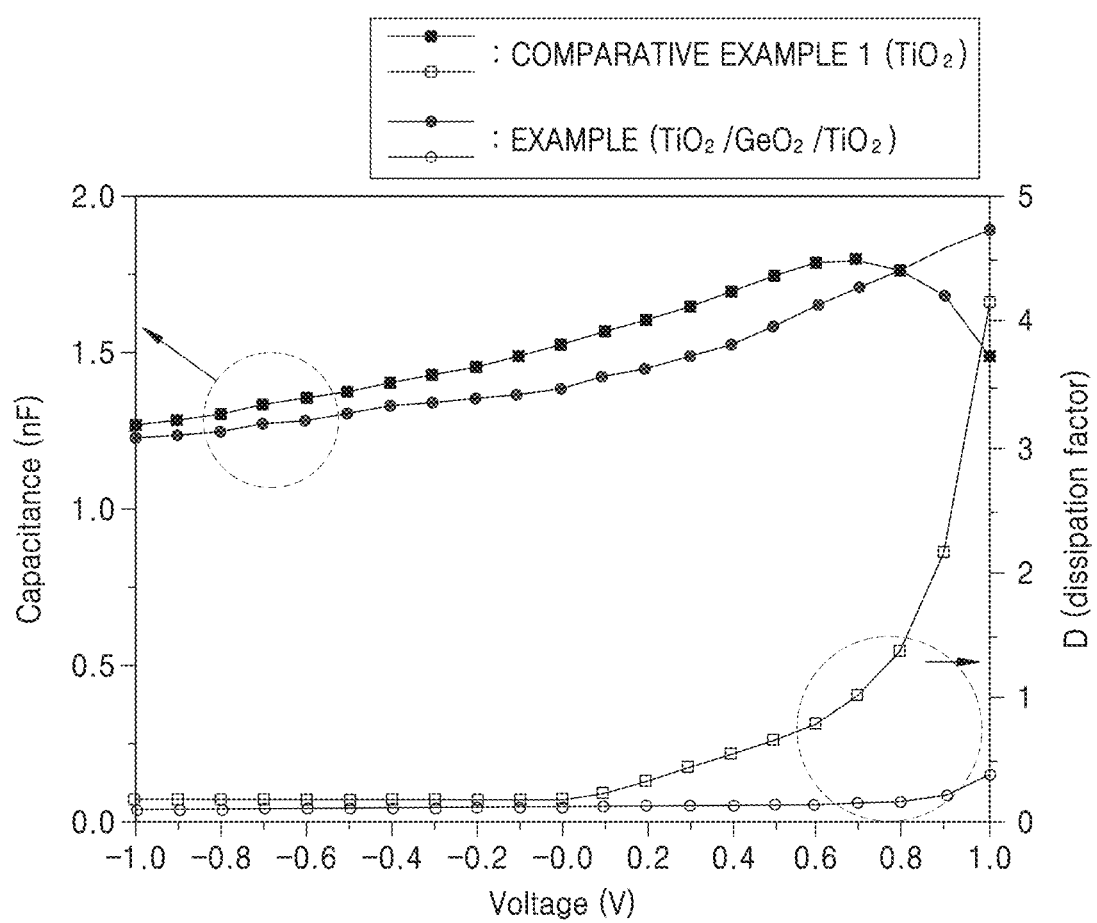
FIG. 5 shows capacitance-voltage (C-V) curves of a capacitor according to some example embodiments and a capacitor according to Comparative Example 1.

FIG. 5 shows capacitance-voltage (C-V) curves of a capacitor according to an Example and a capacitor according to Comparative Example 1.

In the graph, the left vertical axis and filled-in points represent a capacitance and the right vertical axis and the empty points represent a dissipation factor. As the dissipation factor increases, the amount of leakage current increases. In the case of Comparative Example 1, the dissipation factor increases rapidly according to a voltage. The capacitor according to the Example Embodiment ("Example") exhibits a slightly lower capacitance than the capacitor according to Comparative Example 1, but exhibits improved leakage current characteristics with a very small increase in dissipation factor according to an increase in voltage.

Figure 6:
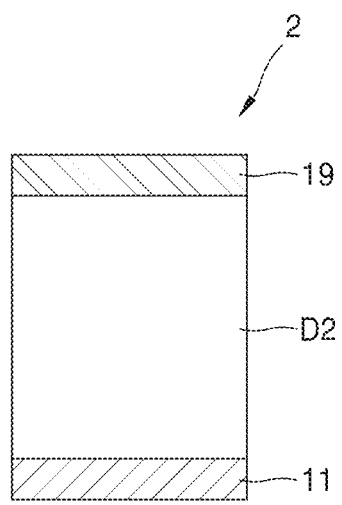
FIG. 6 illustrates a schematic structure of a capacitor according to a Comparative Example 2.

FIG. 6 illustrates a schematic structure of a capacitor 2 according to a Comparative Example 2.

The capacitor 2 includes a lower electrode 11, a dielectric layer D2 including Al-doped $TiO_2$, and an upper electrode 19. In order to maintain a rutile-$TiO_2$ structure, the dielectric layer D2 includes a dopant Al in an amount of about 4 at % (e.g., instead of the form of an inserted layer such as $Al_2O_3$). The dielectric layer D2 exhibits a lower dielectric constant than the dielectric layer D1 provided in the capacitor 1 of FIG. 4, but leakage current characteristics are expected to be improved.

Figure 7:
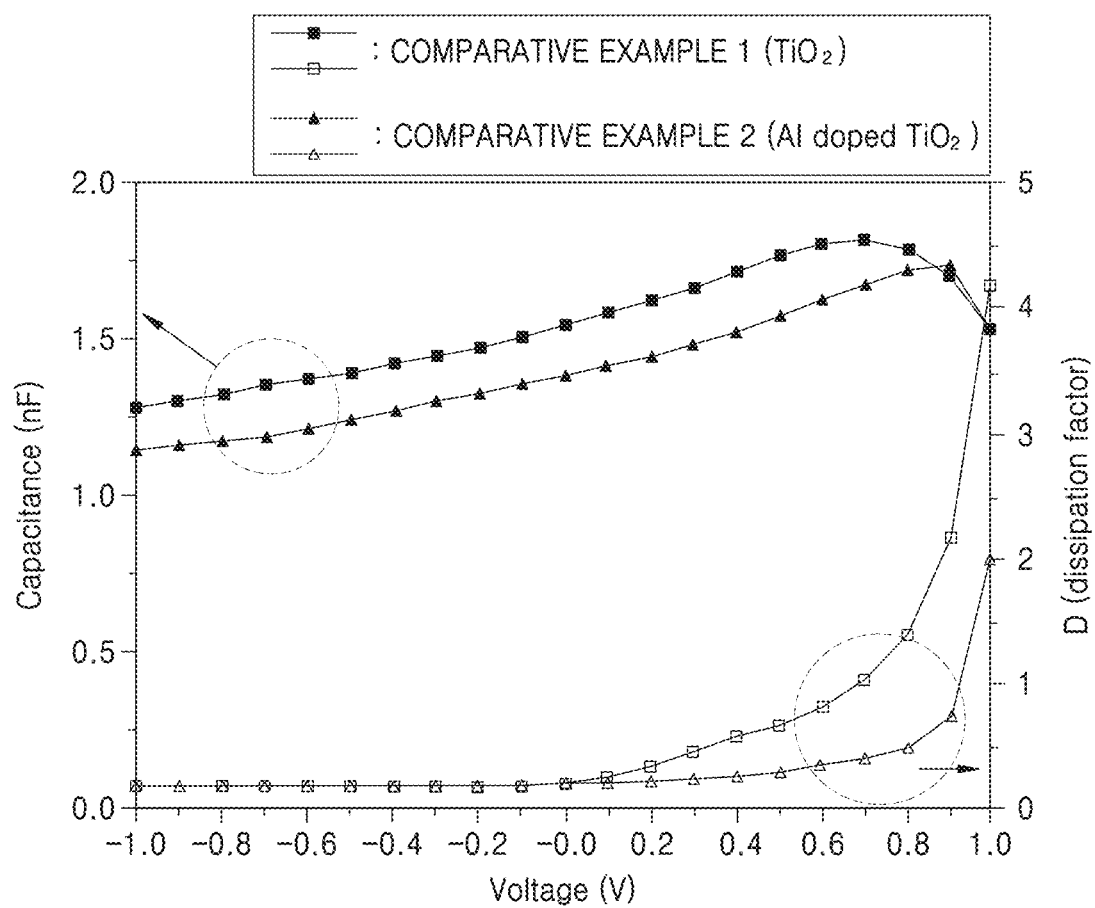
FIG. 7 illustrates C-V curves of the capacitors according to Comparative Examples 1 and 2 of FIGS. 4 and 6.

FIG. 7 shows C-V curves of the capacitors according to the Comparative Examples 1 and 2 of FIGS. 4 and 6.

In the graph, the left vertical axis and filled-in points represent a capacitance and the right vertical axis and empty points represent a dissipation factor.

It may be confirmed that, in the case of Comparative Example 2, the capacitance is slightly reduced compared to Comparative Example 1, but the slope of the increase in dissipation factor according to the increase in voltage is slightly reduced and leakage current characteristics are improved.

Comparing the graph of FIG. 7 with the graph of FIG. 5, it may be confirmed that the improvement effect of the Example Embodiment compared with Comparative Example 1 is much greater than the improvement effect of Comparative Example 2 compared with Comparative Example 1. The capacitance is the greatest in Comparative Example 1 and slightly decreases in the order of the Example and Comparative Example 2. In addition, the slope of the increase in dissipation factor according to the voltage is the greatest in Comparative Example 1 and decreases in the order of Comparative Example 2 and the Example. For example, compared with Comparative Example 1 (in which the dielectric layer includes only rutile-$TiO_2$), the capacitor of the Example Embodiment has a very small decrease in capacitance, but has a lower slope of the increase in dissipation factor. Therefore, it may be confirmed that a leakage current reduction effect is high, compared with the case in which Al-doped $TiO_2$ is used.

Figure 8:
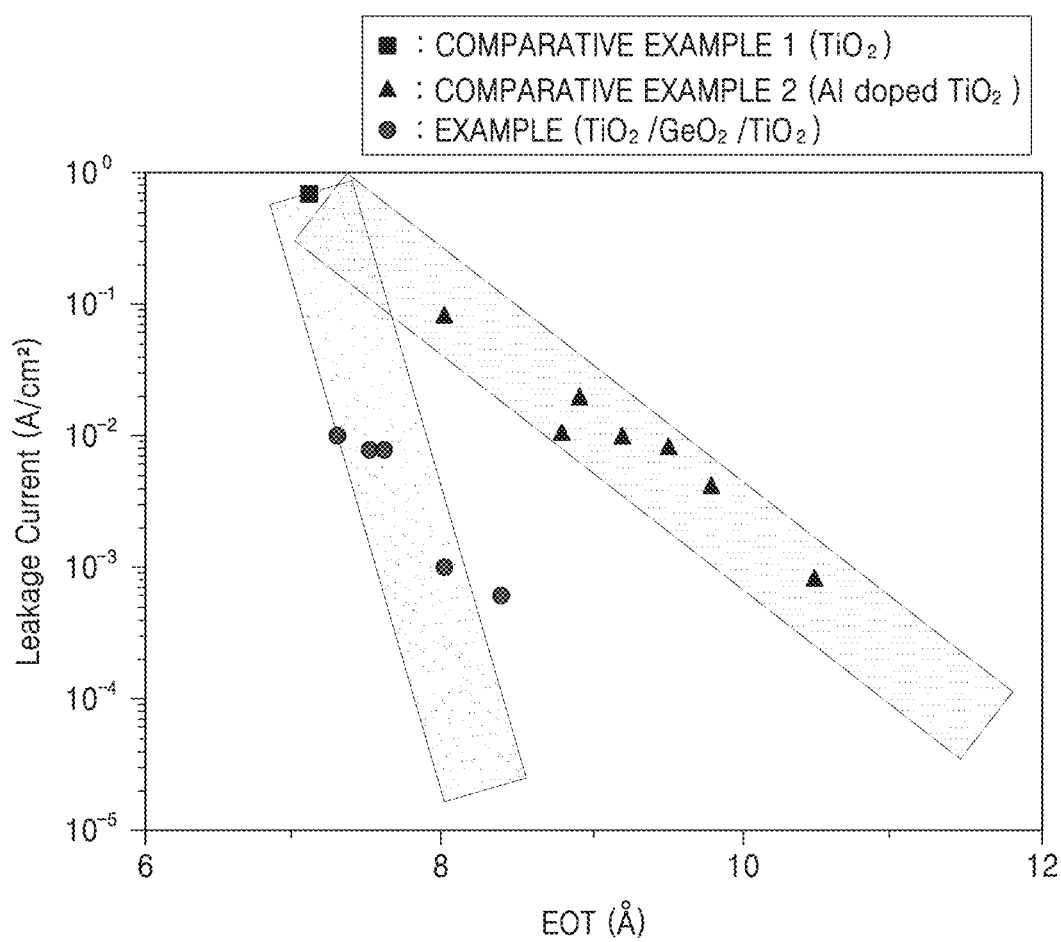
FIG. 8 is a graph showing a comparison between leakage current characteristics of a dielectric according to some example embodiments and Comparative Examples 1 and 2.

FIG. 8 is a graph showing comparison between leakage current characteristics of the Example and Comparative Examples 1 and 2.

In the graph, the horizontal axis represents an effective oxide thickness (EOT) and the vertical axis represents a leakage current. In Comparative Example 2 and the Example, the EOT changes according to the amount of Al and Ge. As the EOT increases, the leakage current decreases. It may be evaluated that, as an absolute value of such a negative slope increases, leakage current characteristics are excellent. As is illustrated in FIG. 8, the slope showing such a trend is different in Comparative Example 2 and the Example. The absolute value of the negative slope is greater in the Example than in Comparative Example 2. Data of the Example is for the case in which the thickness of the $GeO_2$ layer was changed in a range from 0.3 nm to 0.7 nm. As the thickness of the $GeO_2$ layer increases, the loss in terms of the EOT (increase in EOT) is about 10%, but the leakage current is reduced to about $1/100$ to $1/1000$. Therefore, it may be confirmed that the effect is very great.

Figure 9:
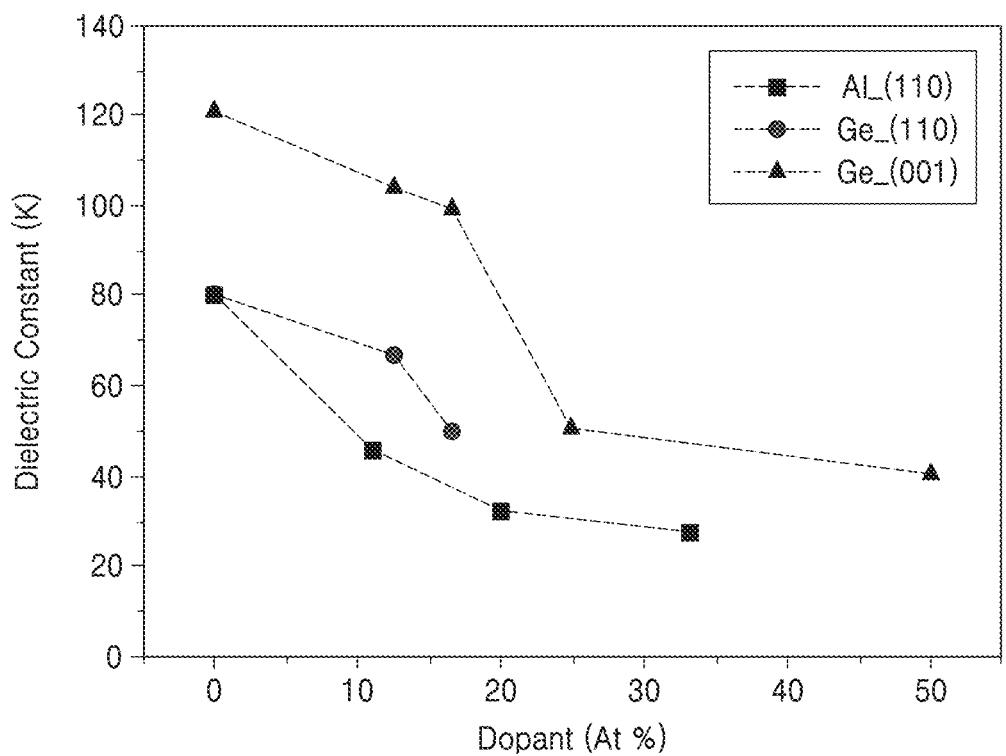
FIG. 9 is a graph obtaining by simulating a change in dielectric constant according to doping amounts of Al and Ge added to $TiO_2$.

FIG. 9 is a graph obtaining by simulating a change in dielectric constant according to doping amounts of Al and Ge added to $TiO_2$.

$TiO_2$ including these dopants shows a lower dielectric constant than $TiO_2$, and the dielectric constant decreases in proportion to the amount of the dopant. From a comparison based on the same amount of dopant, it is confirmed that the decrease in dielectric constant in the case in which Ge is used is smaller than that in the case in which Al is used. For example, based on 10 at %, a dielectric constant for Al_(110) is about 43 and a dielectric constant for Ge_(110) is about 70. Therefore, it may be confirmed that the dielectric constant is greater when Ge is included than when Al is included.

Figure 10:
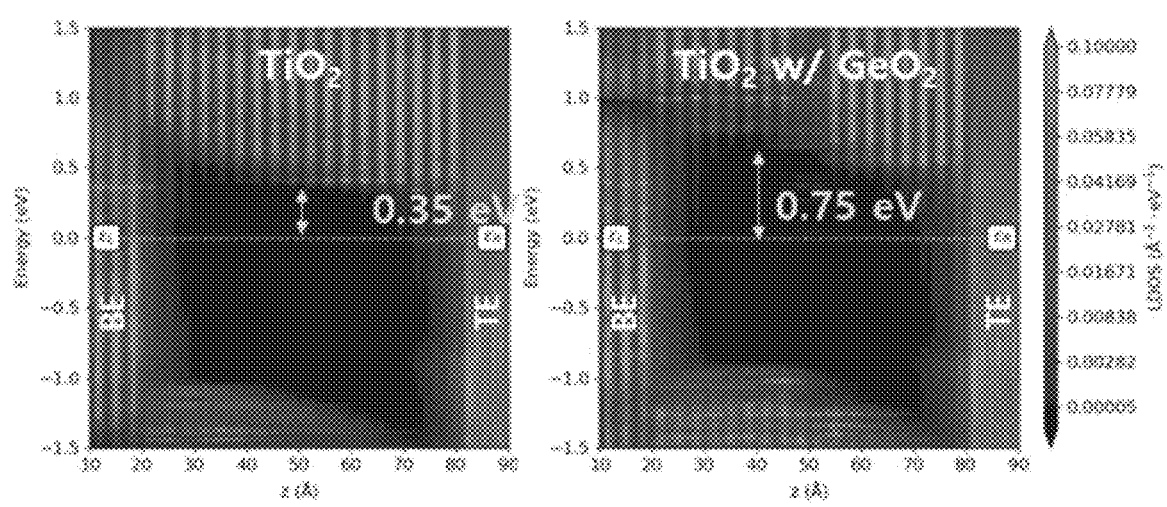
FIG. 10 is a distribution diagram obtained by simulating a local density of state (LDOS) for capacitors according to some example embodiments and a Comparative Example.

FIG. 10 is a distribution diagram obtained by simulating a local density of state (LDOS) for capacitors according to a Comparative Example and an Example.

The left side shows the Comparative Example including a $TiO_2$ dielectric layer, and the right side shows the Example including a $TiO_2$ dielectric layer with $GeO_2$ inserted therein. It is confirmed that conduction band offset (CBO) extracted from the LDOS distribution is about 0.75 eV in the Example, which is higher than the LBOS distribution of 0.35 eV in the Comparative Example.

From the experimental results and computer simulation results, it is confirmed that, when the $GeO_2$ layer is used as the leakage current reducing layer, the leakage current is greatly reduced while the decrease in dielectric constant is reduced.

Figure 11:
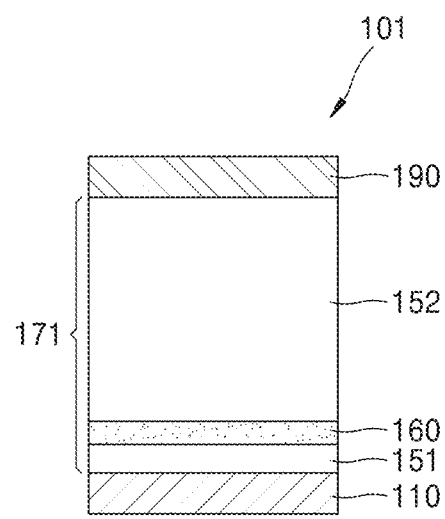
FIG. 11 is a cross-sectional view illustrating a schematic structure of a capacitor, according to some example embodiments.

FIG. 11 is a cross-sectional view illustrating a schematic structure of a capacitor 101, according to some example embodiments.

The capacitor 101 includes a lower electrode 110 and an upper electrode 190 spaced apart from each other, and a dielectric thin-film 171 between the lower electrode 110 and the upper electrode 190. The dielectric thin-film 171 includes a first dielectric layer 151 including $TiO_2$, a second dielectric layer 152 including $TiO_2$, and a leakage current reducing layer 160 located between the first dielectric layer 151 and the second dielectric layer 152 and including $GeO_2$.

Materials of the capacitor 101 may be substantially the same as the materials of the capacitor 100 of FIG. 1. For example, the lower electrode 110 may include a conductive material having a rutile phase, and the first dielectric layer 151 and the second dielectric layer 152 may include rutile phase $TiO_2$. The leakage current reducing layer 160 may include rutile and/or amorphous $GeO_2$. Therefore, redundant detailed descriptions are omitted.

In the capacitor 101, the first dielectric layer 151 formed before the leakage current reducing layer 160 may be different from the second dielectric layer 152 formed after the leakage current reducing layer 160. For example, both the first dielectric layer 151 and the second dielectric layer 152 may include $TiO_2$, and may each independently include a dopant including at least one of Ga, Al, La, B, In, Sc, and/or Y (e.g., in an amount not less than 0 at % and not more than 10 at %). The type and/or amount of dopant included in the first dielectric layer 151 may be different from the type and/or amount of dopant included in the second dielectric layer 152.

The thickness of the first dielectric layer 151 may be different from the thickness of the second dielectric layer 152, and the leakage current reducing layer 160 may be arranged closer to the lower electrode 110, but the present disclosure is not limited thereto.

The capacitor 100 or 101 may be employed in various electronic devices. The capacitor may be used as a dynamic random access memory (DRAM) together with a transistor. In addition, the capacitor may be used for a portion of an electronic circuit constituting an electronic device together with other circuit elements.

Figure 12:
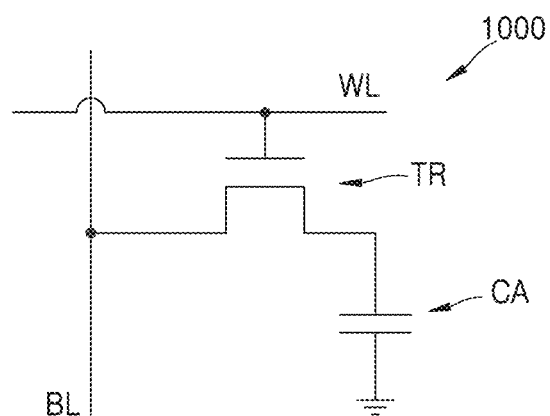
FIG. 12 is a circuit diagram for describing a schematic circuit configuration and operation of an electronic device employing a capacitor, according to some example embodiments.

FIG. 12 is a circuit diagram describing a schematic circuit configuration and operation of an electronic device 1000 employing a capacitor, according to some example embodiments.

The circuit diagram of the electronic device 1000 is for one cell of a DRAM, and the electronic device 1000 includes one transistor TR, one capacitor CA, a word line WL, and a bit line BL. The capacitor CA may be the capacitors 100 and/or 101 described with reference to FIGS. 1 to 11.

A method of writing data to the DRAM is as follows. After a gate voltage (high) for turning the transistor TR on ("ON" state) is applied to a gate electrode through the word line WL, VDD (high) or 0 (low), which is a data voltage value to be input, is applied to the bit line BL. When a high voltage is applied to the word line and the bit line, the capacitor CA is charged (e.g., data "1" is written). When a high voltage is applied to the word line and a low voltage is applied to the bit line, the capacitor CA is discharged (e.g., data "0" is written).

A method of reading data from the DRAM is as follows. After a high voltage is applied to the word line WL to turn on the transistor TR of the DRAM, a voltage of VDD/2 is applied to the bit line BL. When the data of the DRAM is "1" (e.g., when the voltage of the capacitor CA is VDD)) charges stored in the capacitor CA slowly move to the bit line BL and the voltage of the bit line BL becomes slightly higher than VDD/2. In contrast, when the data of capacitor CA is "0", charges of the bit line BL move to the capacitor CA and the voltage of the bit line BL becomes slightly lower than VDD/2. A sense amplifier (not illustrated) may sense and amplify the potential difference of the bit line and determine whether the data is "0" or "1."

Figure 13:
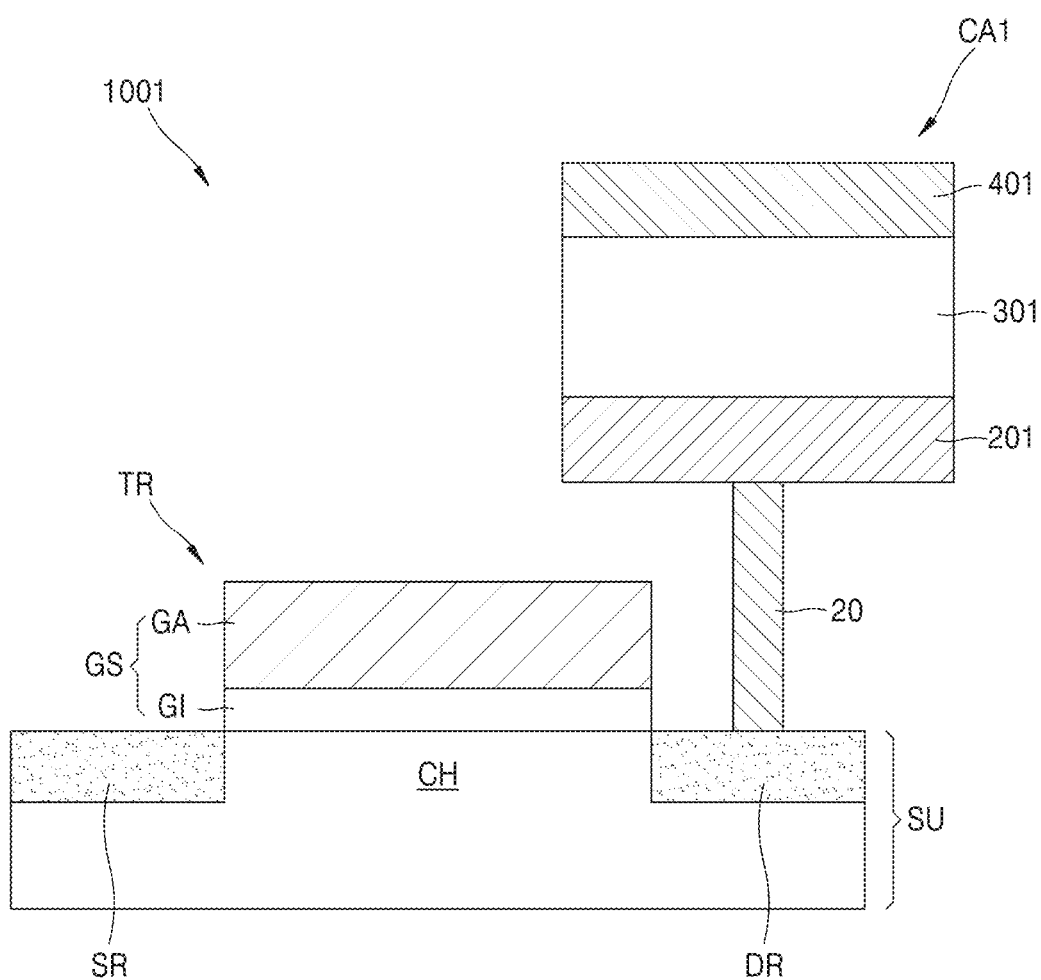
FIG. 13 is a schematic diagram illustrating an electronic device according to some example embodiments.

FIG. 13 is a schematic diagram illustrating an electronic device 1001 according to some example embodiments.

Referring to FIG. 13, the electronic device 1001 may include a structure in which a capacitor CA1 and a transistor TR are electrically connected to each other through a contact 20. The capacitor CA1 includes a lower electrode 201, an upper electrode 401, and a dielectric thin-film 301 between the lower electrode 201 and the upper electrode 401. The capacitor CA1 may be the capacitors 100 and/or 101 described with reference to FIGS. 1 to 11. For example, the dielectric thin-film 301 may be at least one of the dielectric thin-film 170 and/or 171, one of the lower electrode 201 or the upper electrode 401 may be (and/or include) the lower electrode 110, and the other of the lower electrode 201 or the upper electrode 401 may be (and/or include) the upper electrode 190. Because this has been described above, detailed descriptions thereof are omitted.

The transistor TR may be a field effect transistor. The transistor TR includes a semiconductor substrate SU and a gate stack GS. The semiconductor substrate SU includes a source region SR, a drain region DR, and a channel region CH. The gate stack GS is arranged on the semiconductor substrate SU, faces the channel region CH, and includes a gate insulating layer GI and a gate electrode GA.

The channel region CH is a region between the source region SR and the drain region DR, and is electrically connected to the source region SR and the drain region DR. The source region SR may be electrically connected to or in contact with one end of the channel region CH, and the drain region DR may be electrically connected or in contact with the other end of the channel region CH. The channel region CH may be defined as a substrate region between the source region SR and the drain region DR in the semiconductor substrate SU.

The semiconductor substrate SU may include a semiconductor material. The semiconductor substrate SU may include, for example, a semiconductor materials such as silicon (Si), germanium (Ge), silicon germanium (SiGe), silicon carbide (SiC), gallium arsenide (GaAs), indium arsenide (InAs), or indium phosphide (InP). In addition, the semiconductor substrate SU may include a silicon on insulator (SOI) substrate.

The source region SR, the drain region DR, and the channel region CH may each independently be formed by implanting impurities into different regions of the semiconductor substrate SU. In this case, the source region SR, the channel region CH, and the drain region DR may include a substrate material as a base material. The source region SR and the drain region DR may include a conductive material. In this case, the source region SR and the drain region DR may include, for example, a metal, a metal compound, or a conductive polymer.

The channel region CH may be implemented as a separate material layer (thin-film), unlike the illustration thereof. In this case, for example, the channel region CH may include at least one of Si, Ge, SiGe, a Group III-V semiconductor, an oxide semiconductor, a nitride semiconductor, an oxynitride semiconductor, a two-dimensional (2D) material, a quantum dot (QD), an organic semiconductor, and/or the like. For example, the oxide semiconductor may include InGaZnO or the like, the 2D material may include transition metal dichalcogenide (TMD), graphene, and/pr the like, and the QD may include a colloidal QD, a nanocrystal structure, and/or the like.

The gate electrode GA may be arranged on the semiconductor substrate SU, and may face the channel region CH while being spaced apart from the semiconductor substrate SU. The gate electrode GA may include at least one of a metal, a metal nitride, a metal carbide, polysilicon, and/or the like. For example, the metal may include at least one of aluminum (Al), tungsten (W), molybdenum (Mo), titanium (Ti), tantalum (Ta), and/or the like, and the metal nitride may include at least one of titanium nitride (TiN), tantalum nitride (TaN), and/or the like. The metal carbide may include at least one of aluminum-doped (or aluminum-containing) metal carbide, silicon-doped (or silicon-containing) metal carbide, and/or the like. For example, the metal carbide may include at least one of TiAlC, TaAlC, TiSiC, and/or TaSiC.

In some example embodiments, the gate electrode GA may have a structure in which a plurality of materials are stacked. For example, the gate electrode GA may have a structure in which a metal nitride layer and a metal layer are stacked (e.g., TiN/Al), or a structure in which a metal nitride layer, a metal carbide layer, and a metal layer are stacked (e.g., TiN/TiAlC/W). However, the materials described above are only an example, and the example embodiments are not limited thereto.

The gate insulating layer GI may be further arranged between the semiconductor substrate SU and the gate electrode GA. The gate insulating layer GI may include a paraelectric material or a high-k dielectric material, and may have, e.g., a dielectric constant of about 20 to about 70.

For example, the gate insulating layer GI may include at least one of silicon oxide, silicon nitride, aluminum oxide, hafnium oxide, zirconium oxide, and/or the like, and/or may include a 2D insulator such as hexagonal boron nitride (h-BN). For example, the gate insulating layer GI may include silicon oxide ($SiO_2$), silicon nitride ($SiN_x$), and/or the like, and/or may include hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), hafnium zirconium oxide ($HfZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}Ta_{0.5}O_3$), lead zinc niobate ($PbZnNbO_3$), and/or the like. In addition, the gate insulating layer GI may include metal nitride oxide (such as aluminum oxynitride (AION), zirconium oxynitride (ZrON), hafnium oxynitride (HfON), lanthanum oxynitride (LaON), yttrium oxynitride (YON), and/or the like), silicate (such as ZrSiON, HfSiON, YSiON, LaSiON, and/or the like), and/or aluminate (such as ZrAION HfAION, and/or the like). In addition, the gate insulating layer GI may include the dielectric thin-film 171 and 172 described above. The gate insulating layer GI may constitute a gate stack together with the gate electrode GA. The gate stack may be connected to the word line WL, as illustrated in FIG. 12.

One of the lower electrode 201 or the upper electrode 401 of the capacitor CA1 and one of the source region SR or the drain region DR of the transistor TR may be electrically connected to each other through the contact 20. The contact 20 may include a conductive material, for example, at least one of tungsten, copper, aluminum, and/or polysilicon.

The arrangement of the capacitor CA1 and the transistor TR may be variously modified. For example, the capacitor CA1 may be arranged on the semiconductor substrate SU, and/or may be buried in the semiconductor substrate SU.

FIG. 13 illustrates that the electronic device 1001 includes one capacitor CA1 and one transistor TR, but this is only an example, and the electronic device 1001 may include a plurality of capacitors and a plurality of transistors.

Figure 14:
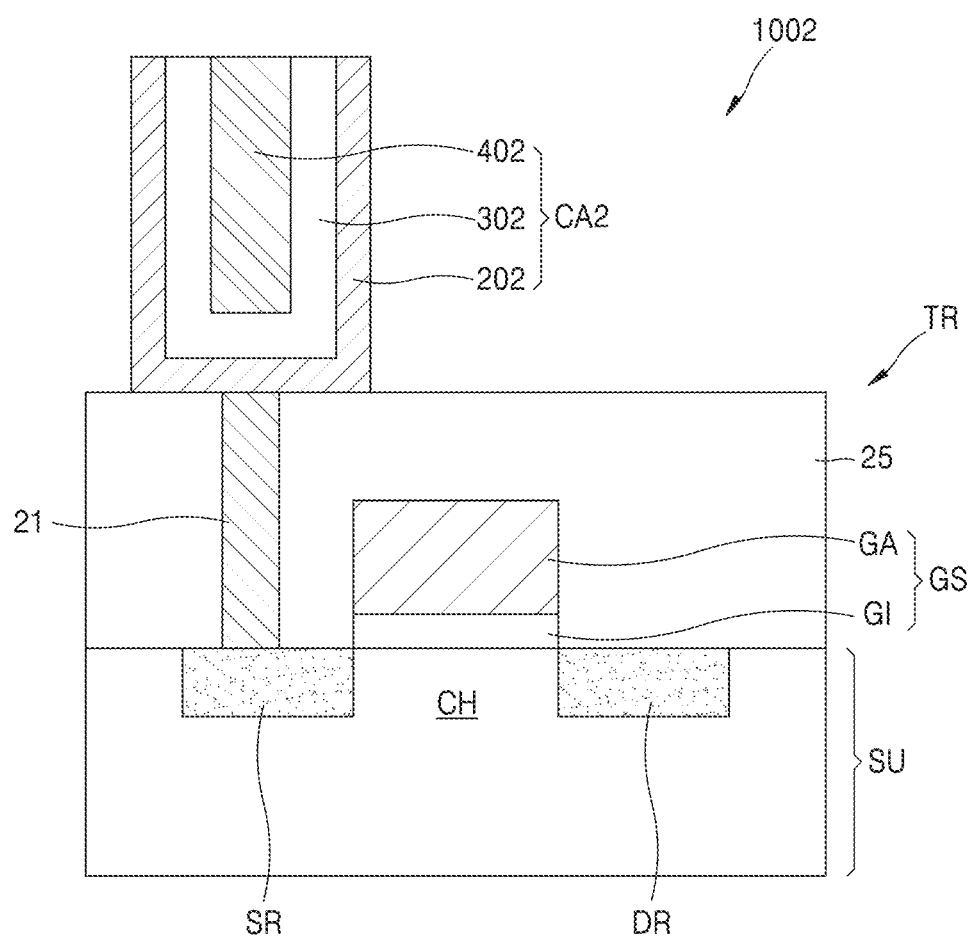
FIG. 14 is a schematic diagram illustrating an electronic device according to some example embodiments.

FIG. 14 is a schematic diagram illustrating an electronic device 1002 according to some example embodiments.

Referring to FIG. 14, the electronic device 1002 may include a structure in which a capacitor CA2 and a transistor TR are electrically connected to each other through a contact 21.

The transistor TR includes a semiconductor substrate SU and a gate stack GS. The semiconductor substrate SU includes a source region SR, a drain region DR, and a channel region CH. The gate stack GS is arranged on the semiconductor substrate SU, faces the channel region CH, and includes a gate insulating layer GI and a gate electrode GA.

An interlayer insulating layer 25 may be provided on the semiconductor substrate SU to cover the gate stack GS. The interlayer insulating layer 25 may include an insulating material. For example, the interlayer insulating layer 25 may include at least one of Si oxide (e.g., $SiO_2$), Al oxide (e.g., $Al_2O_3$), and/or a high-k material (e.g., $HfO_2$). The contact 21 passes through the interlayer insulating layer 25 to electrically connect the transistor TR to the capacitor CA2.

The capacitor CA2 includes a lower electrode 202, an upper electrode 402, and a dielectric thin-film 302 between the lower electrode 202 and the upper electrode 402. The lower electrode 202 and the upper electrode 402 are provided in a shape capable of increasing and/or maximizing the contact area with the dielectric thin-film 302. The example embodiments are not limited to the configuration illustrated in FIG. 14. For example, in some example embodiments, the capacitor CA2 may be differently oriented, such that the upper electrode 402 electrically contacts the contact 21 The material of the capacitor CA2 may be substantially the same as the material of the capacitors 100 and 101 described with reference to FIGS. 1 to 11.

Figure 15:
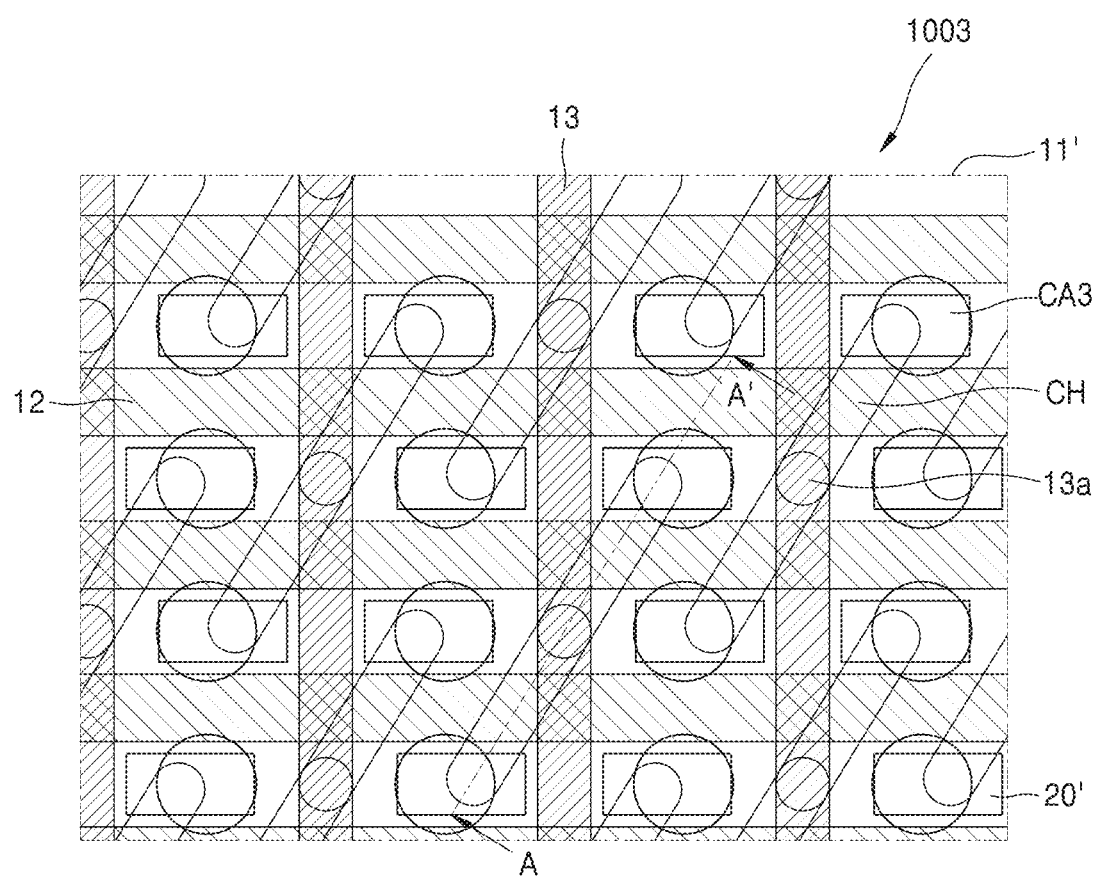
FIG. 15 is a plan view illustrating an electronic device according to some example embodiments.
Figure 15:
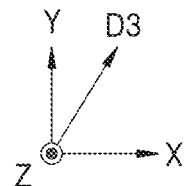

FIG. 15 is a plan view illustrating an electronic device 1003 according to some example embodiments.

Referring to FIG. 15, the electronic device 1003 may include a structure in which a plurality of capacitors and a plurality of field effect transistors are repeatedly arranged. The electronic device 1003 may include a field effect transistor, a contact structure 20', and a capacitor CA3. The field effect transistor includes a source, a drain, and a channel. The field effect transistor includes a semiconductor substrate 11' and a gate stack 12. The contact structure 20' is arranged on the semiconductor substrate 11' so as not to overlap the gate stack 12. The capacitor CA3 is arranged on the contact structure 20'. The electronic device 1003 may further include a bit line structure 13 electrically connecting the field effect transistors to each other. The capacitor CA3, the gate stack 12 and/or the contact structure 20' may, respectively, be substantially similar to the capacitor CA1 and/or CA2, the gate stack GS, and/or the contact 20 and/or 21, as illustrated in FIGS. 13 and 14.

Although FIG. 15 illustrates that both the contact structure 20' and the capacitor CA3 are repeatedly arranged in the X and Y directions, the present disclosure is not limited thereto. For example, the contact structure 20' may be arranged in the X and Y directions, and the capacitor CA3 may be arranged in a hexagonal shape such as a honeycomb structure.

Figure 16:
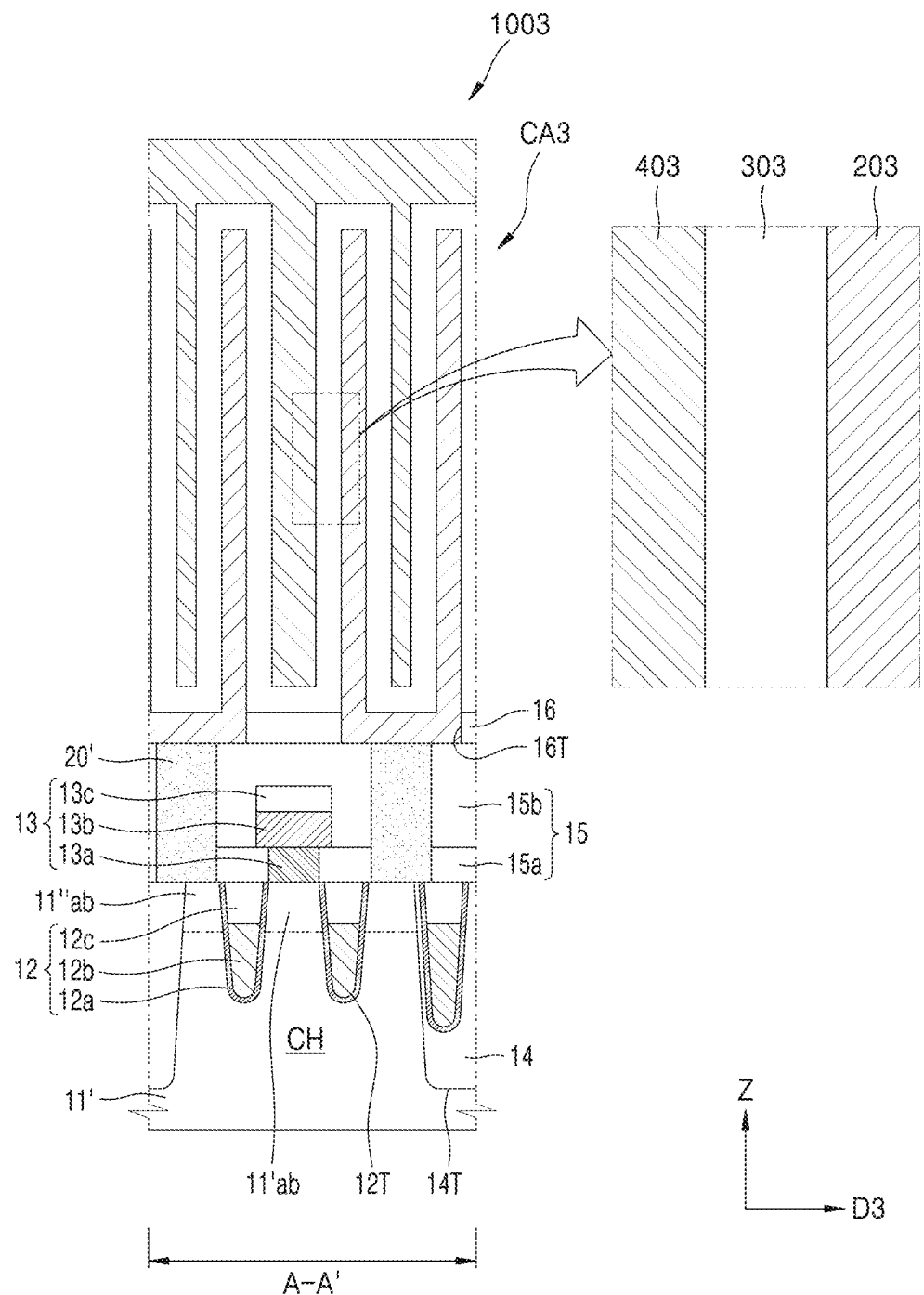
FIG. 16 is a cross-sectional view of the electronic device taken along line A-A' of FIG. 15.

FIG. 16 is a cross-sectional view of the electronic device 1003 taken along line A-A' of FIG. 15.

Referring to FIG. 16, the semiconductor substrate 11' may have a shallow trench isolation (STI) structure including a device isolation layer 14. The device isolation layer 14 may be a single layer including one type of insulating layer, or multiple layers including a combination of two or more types of insulating layers. The device isolation layer 14 may include a device isolation trench 14T in the semiconductor substrate 11', and the device isolation trench 14T may be filled with an insulating material. The insulating material may include at least one of fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), tonen silazene (TOSZ), and/or the like, but the present disclosure is not limited thereto.

The semiconductor substrate 11' may further include a channel region CH defined by the device isolation layer 14, and a gate line trench 12T parallel to the upper surface of the semiconductor substrate 11' and extending in the X direction. The channel region CH may have a relatively long island shape having a minor axis and a major axis. The major axis of the channel region CH may be arranged in a D3 direction parallel to the upper surface of the semiconductor substrate 11', as illustrated in FIG. 15.

The gate line trench 12T may be arranged to cross the channel region CH at a certain depth from the upper surface of the semiconductor substrate 11', or may be arranged inside the channel region CH. The gate line trench 12T may also be arranged inside the device isolation trench 14T. The gate line trench 12T inside the device isolation trench 14T may have a lower bottom surface than that of the gate line trench 12T of the channel region CH. A first source/drain 11'*ab* and a second source/drain 11"*ab* may be arranged in an upper portion of the channel region CH located at both sides of the gate line trench 12T.

The gate stack 12 may be arranged inside the gate line trench 12T. For example, a gate insulating layer 12a, a gate electrode 12b, and a gate capping layer 12c may be sequentially arranged inside the gate line trench 12T. The gate insulating layer 12a and the gate electrode 12b may be the same as described above, and the gate capping layer 12c may include at least one of silicon oxide, silicon oxynitride, and silicon nitride. The gate capping layer 12c may be arranged on the gate electrode 12b to fill the remaining portion of the gate line trench 12T.

A bit line structure 13 may be arranged on the first source/drain 11'ab. The bit line structure 13 may be arranged parallel to the upper surface of the semiconductor substrate 11' and extend in the Y direction. The bit line structure 13 may be electrically connected to the first source/drain 11'ab, and may include a bit line contact 13a, a bit line 13b, and a bit line capping layer 13c, which are sequentially stacked on the substrate. For example, the bit line contact 13a may include polysilicon, the bit line 13b may include a metal material, and/or the bit line capping layer 13c may include an insulating material such as silicon nitride or silicon oxynitride.

Although FIG. 16 illustrates that the bit line contact 13a has a bottom surface at the same level as the upper surface of the semiconductor substrate 11', this is only an example, and the present disclosure is not limited thereto. For example, in another embodiment, a recess formed to a certain depth from the upper surface of the semiconductor substrate 11' may be further provided. The bit line contact 13a may extend to the inside of the recess so that the bottom surface of the bit line contact 13a is lower than the upper surface of the semiconductor substrate 11'.

The bit line structure 13 may further include a bit line intermediate layer (not illustrated) between the bit line contact 13a and the bit line 13b. The bit line intermediate layer may include metal silicide such as tungsten silicide, or metal nitride such as tungsten nitride. In addition, a bit line spacer (not illustrated) may be further formed on a sidewall of the bit line structure 13. The bit line spacer may have a single-layer structure or a multilayer structure, and may include an insulating material such as silicon oxide, silicon oxynitride, or silicon nitride. In addition, the bit line spacer may further include an air space (not illustrated).

The contact structure 20' may be arranged on the second source/drain 11"ab. The contact structure 20' and the bit line structure 13 may be arranged on different sources/drains on the substrate. The contact structure 20' may have a structure in which a lower contact pattern (not illustrated), a metal silicide layer (not illustrated), and an upper contact pattern (not illustrated) are sequentially stacked on the second source/drain 11"ab. The contact structure 20' may further include a barrier layer (not illustrated) surrounding the side surface and the bottom surface of the upper contact pattern. For example, the lower contact pattern may include polysilicon, the upper contact pattern may include a metal material, and the barrier layer may include a conductive metal nitride.

A capacitor CA3 may be arranged on the semiconductor substrate 11' and electrically connected to the contact structure 20'. For example, the capacitor CA3 may include a lower electrode 203 electrically connected to the contact structure 20', an upper electrode 403 apart from the lower electrode 203, and a dielectric thin-film 303 between the lower electrode 203 and the upper electrode 403. The lower electrode 203 may have a cylindrical shape or a cup shape having an internal space with a closed bottom. The upper electrode 403 may have a comb shape having comb teeth extending into an internal space formed by the lower electrode 203 and a region between the adjacent lower electrodes 203. The dielectric thin-film 303 may be arranged between the lower electrode 203 and the upper electrode 403 so as to be parallel to the surfaces of the lower electrode 203 and the upper electrode 403.

Because materials of the lower electrode 203, the dielectric thin-film 303, and the upper electrode 403 constituting the capacitor CA3 are substantially the same as those of the capacitors 100 and 101 described with reference to FIGS. 1 to 11, detailed descriptions thereof are omitted.

An interlayer insulating layer 15 may be further arranged between the capacitor CA3 and the semiconductor substrate 11'. The interlayer insulating layer 15 may be arranged in a space between the capacitor CA3 and the semiconductor substrate 11', in which other structures are not arranged. For example, the interlayer insulating layer 15 may be arranged to cover a wiring and/or electrode structure such as the bit line structure 13, the contact structure 20', and the gate stack 12 on the substrate. For example, the interlayer insulating layer 15 may surround a wall of the contact structure 20'. The interlayer insulating layer 15 may include a first interlayer insulating layer 15a surrounding the bit line contact 13a, and a second interlayer insulating layer 15b covering the side surfaces and/or the upper surfaces of the bit line 13b and the bit line capping layer 13c.

In addition, when a plurality of capacitors CA3 are arranged, bottom surfaces of a plurality of lower electrodes 203 may be separated from each other by an etch stop layer 16. For example, the etch stop layer 16 may include an opening 16T, and the bottom surface of the lower electrode 203 of the capacitor CA3 may be arranged in the opening 16T. As illustrated, the lower electrode 203 may have a cylindrical shape and/or a cup shape having an internal space with a closed bottom. The capacitor CA3 may further include a support (not illustrated) that prevents the lower electrode 203 from being tilted or collapsed. The support may be arranged on the sidewall of the lower electrode 203.

Figure 17:
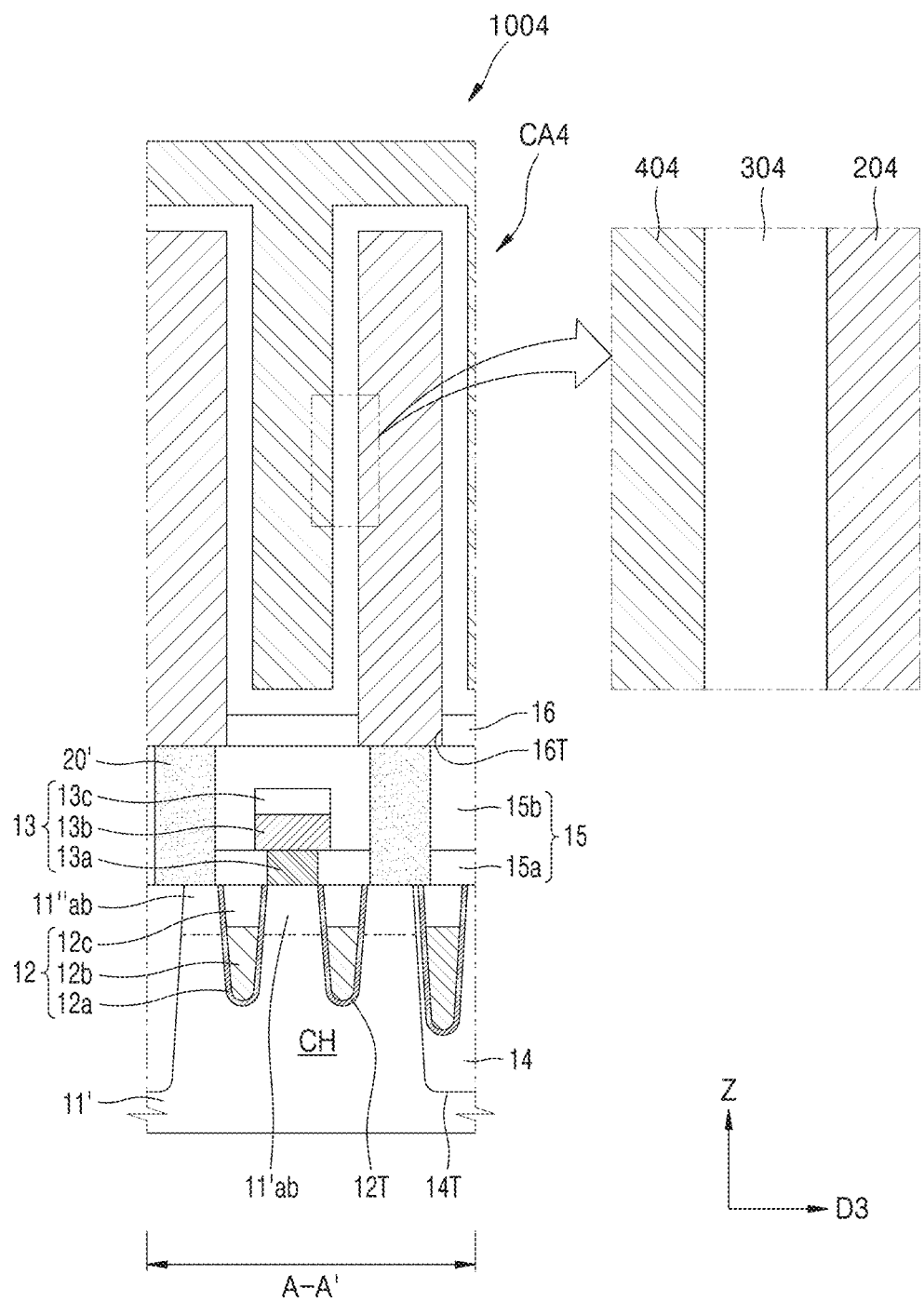
FIG. 17 is a cross-sectional view illustrating an electronic device according to some example embodiments.

FIG. 17 is a cross-sectional view illustrating an electronic device 1004 according to another example embodiment.

The cross-sectional view of the electronic device 1004 according to the present embodiment corresponds to the cross-sectional view taken along line A-A' of FIG. 15, and the electronic device of FIG. 17 differs from the electronic device 1003 of FIG. 16 only in a shape of a capacitor CA4. The capacitor CA4 is arranged on a semiconductor substrate 11' and electrically connected to a contact structure 20'. The capacitor CA4 includes a lower electrode 204 electrically connected to the contact structure 20', an upper electrode 404 apart from the lower electrode 204, and a dielectric thin-film 304 between the lower electrode 204 and the upper electrode 404. Materials of the lower electrode 204, the dielectric thin-film 304, and the upper electrode 404 are the same as those of the capacitors 100 and 101 described with reference to FIGS. 1 to 11.

The lower electrode 204 may have a pillar shape, such as a cylinder, a square pillar, and/or a polygonal pillar, which extends in the vertical direction (Z direction). The upper electrode 404 may have a comb shape having comb teeth extending into a region between the adjacent lower electrodes 204. The dielectric thin-film 304 may be arranged between the lower electrode 204 and the upper electrode 404 so as to be parallel to the surfaces of the lower electrode 204 and the upper electrode 404.

The capacitors and the electronic devices, according to the above-described example embodiments may be applied to various application fields. For example, the electronic devices according to the embodiments may be applied as logic devices or memory devices. The electronic devices according to the embodiments may be used for arithmetic operations, program execution, temporary data retention, and the like in devices such as mobile devices, computers, laptop computers, sensors, network devices, and neuromorphic devices. In addition, the electronic devices according to the embodiments may be useful for devices in which an amount of data transmission is large and data transmission is continuously performed.

Figure 18:
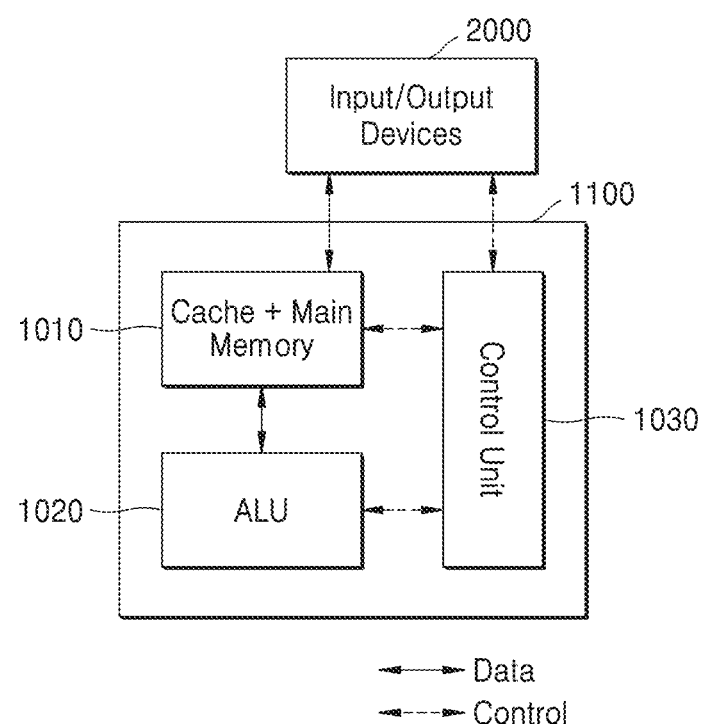
FIGS. 18 and 19 are conceptual diagrams schematically illustrating a device architecture applicable to a device according to some example embodiments.
Figure 19:
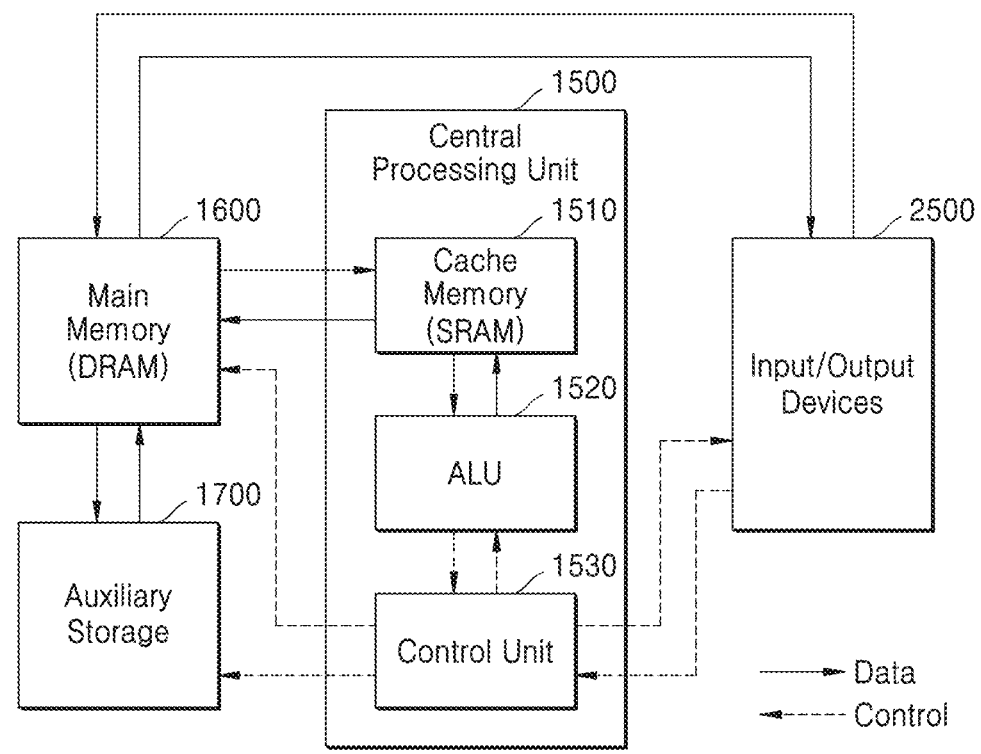

FIGS. 18 and 19 are conceptual diagrams schematically illustrating device architectures applicable to a device according to an example embodiment.

Referring to FIG. 18, an electronic device architecture 1100 may include a memory unit 1010, an arithmetic logic unit (ALU) 1020, and a control unit 1030. The memory unit 1010, the ALU 1020, and the control unit 1030 may be electrically connected to each other. For example, the electronic device architecture 1100 may be implemented as a single chip including the memory unit 1010, the ALU 1020, and the control unit 1030.

The memory unit 1010, the ALU 1020, and the control unit 1030 may be interconnected in an on-chip manner via a metal line to perform direct communication. The memory unit 1010, the ALU 1020, and the control unit 1030 may be monolithically integrated on a single substrate to constitute a single chip. Input/output devices 2000 may be connected to the electronic device architecture (chip) 1100. In addition, the memory unit 1010 may include both a main memory and a cache memory. The electronic device architecture (chip) 1100 may be an on-chip memory processing unit. The memory unit 1010 may each include the capacitor and the electronic device including the same, which have been described above. The ALU 1020 or the control unit 1030 may also include the capacitor described above.

Referring to FIG. 19, a cache memory 1510, an ALU 1520, and a control unit 1530 may constitute a central processing unit (CPU) 1500, and the cache memory 1510 may include a static random access memory (SRAM). Apart from the CPU 1500, a main memory 1600 and an auxiliary storage 1700 may be provided. The capacitor 100 and/or 101 may be included in device architecture of FIG. 18 and/or 19. For example, the memory unit 1010 and/or the main memory 1600 may be a DRAM, and may include, e.g., at least one of the capacitors described above. In some cases, the electronic device architecture may be implemented in a form in which computing unit elements and memory unit elements are adjacent to each other on a single chip, without distinction of sub-units.

The capacitor described above has a high electric capacity and has excellent leakage current blocking or reduction characteristics.

The electronic element including such a capacitor may easily implement a high degree of integration, thereby contributing to miniaturization of the electronic device.

It should be understood that the example embodiments described herein should be considered in a descriptive sense only and not for purposes of limitation. Descriptions of features or aspects within each example embodiment should typically be considered as available for other similar features or aspects in other example embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:
   a lower electrode;
   an upper electrode apart from the lower electrode; and
   a dielectric between the lower electrode and the upper electrode, the dielectric comprising a dielectric layer including $TiO_2$, and a leakage current reducing layer including $GeO_2$ in the dielectric layer such that the $TiO_2$ is above and below the leakage current reducing layer,
   wherein the leakage current reducing layer has at least one of a rutile phase or an amorphous phase.

2. The capacitor of claim 1, wherein the lower electrode has a rutile phase.

3. The capacitor of claim 2, wherein the lower electrode includes $SnO_2$ doped with a dopant including at least one of a metal or a metal oxide.

4. The capacitor of claim 3, wherein
   the dopant includes at least one of $RuO_2$, $IrO_2$, $MoO_2$, Nb, Ta, Sb, Mn, or F, and
   the dopant is included in an amount between 0.01 at % and 10 at %.

5. The capacitor of claim 1, wherein the dielectric layer includes at least one of Ga, Al, La, B, In, Sc, or Y, as a dopant, in an amount of 10 at % or less.

6. The capacitor of claim 1, wherein the leakage current reducing layer includes at least one of Ga, Al, La, B, In, Sc, Y, Ti, Zr, or Hf, as a dopant, in an amount of 50 at % or less.

7. The capacitor of claim 1, wherein the dielectric layer has a rutile phase.

8. The capacitor of claim 1, wherein the dielectric is a thin-film having a thickness of 200 Å or less.

9. The capacitor of claim 1, wherein the leakage current reducing layer has a thickness of 50 Å or less.

10. The capacitor of claim 1, wherein a ratio of a thickness of the leakage current reducing layer to a total thickness of the dielectric is in a range from 0.5% to 40%.

11. The capacitor of claim 1, wherein the dielectric has a dielectric constant of 50 or more and a conduction band offset (CBO) of 0.6 eV or more.

12. An electronic device comprising:
    a transistor; and
    the capacitor of claim 1 electrically connected to the transistor.

13. The electronic device of claim 12, wherein the transistor comprises:
    a substrate comprising a source region, a drain region, and a channel region between the source region and the drain region; and
    a gate stack on the substrate and facing the channel region, the gate stack comprising a gate insulating layer and a gate electrode.

14. The electronic device of claim 12, wherein the transistor comprises:
    a substrate comprising a source region, a drain region, and a channel region between the source region and the drain region; and
    a gate stack in a trench recessed from a surface of the substrate and facing the channel region, the gate stack comprising a gate insulating layer and a gate electrode.

15. The electronic device of claim 12, further comprising:
    a memory unit comprising the capacitor and the transistor; and
    a control unit electrically connected to the memory unit and configured to control the memory unit.

16. A capacitor comprising:
a lower electrode;
an upper electrode apart from the lower electrode; and
a dielectric between the lower electrode and the upper electrode, the dielectric including
a first dielectric layer including $TiO_2$,
a second dielectric layer apart from the first dielectric layer, the second dielectric layer including $TiO_2$, and
a leakage current reducing layer between the first dielectric layer and the second dielectric layer, the leakage current reducing layer including $GeO_2$,
wherein the leakage current reducing layer has at least one of a rutile phase or an amorphous phase.

17. The capacitor of claim 16, wherein the lower electrode has a rutile phase.

18. The capacitor of claim 16, wherein the first dielectric layer and the second dielectric layer have a rutile phase.

19. The capacitor of claim 16, wherein the first dielectric layer and the second dielectric layer each independently include at least one of Ga, Al, La, B, In, Sc, or Y, as a dopant, in an amount of 10 at % or less.

20. The capacitor of claim 19, wherein the dopant of the first dielectric layer and the dopant of the second dielectric layer differ in at least one of the amount or the at least one of Ga, Al, La, B, In, Sc, or Y.

21. The capacitor of claim 16, wherein the leakage current reducing layer includes at least one of Ga, Al, La, B, In, Sc, Y, Ti, Zr, or Hf, as a dopant, in an amount of 50 at % or less.

22. The capacitor of claim 16, wherein a ratio of a thickness of the leakage current reducing layer to a total thickness of the dielectric is in a range from 0.5% to 40%.

23. An electronic device comprising:
a transistor; and
the capacitor of claim 16 electrically connected to the transistor.

* * * * *